United States Patent [19]

Kinsner et al.

[11] 4,094,003
[45] June 6, 1978

[54] SONIC MAGNETIC DOMAIN SENSOR

[75] Inventors: Witold Kinsner, Hamilton; Edward Della Torre, Toronto, both of Canada

[73] Assignee: Canadian Patents and Development Limited, Ottawa, Canada

[21] Appl. No.: 671,144

[22] Filed: Mar. 29, 1976

[51] Int. Cl.² ............................................. G11C 19/08
[52] U.S. Cl. .......................................... 365/7; 365/2; 365/15; 365/33; 365/34; 365/157
[58] Field of Search ................ 340/174 TF, 174 MS; 365/7, 1

[56] References Cited

U.S. PATENT DOCUMENTS

| | | | |
|---|---|---|---|
| 3,151,316 | 9/1967 | Bobeck | 340/174 MS |
| 3,673,582 | 6/1972 | Clover, Jr. | 365/1 |
| 3,836,897 | 9/1974 | Marsh | 340/174 TF |

*Primary Examiner*—James W. Moffitt
*Attorney, Agent, or Firm*—Edward Rymek

[57] ABSTRACT

This bubble domain sensor is capable of sensing the presence or absence of a bubble at a predetermined location within bubble supporting material regardless of whether the bubble is stationary or moving through that location. A magnetostrictive material layer, such as a thin film having an area approximately equal to the area of a bubble domain, is positioned with respect to the bubble material such that it is magnetically influenced by the closure field of a bubble at the predetermined location. A conductor, such as a strip conductor, is positioned in contact with the magnetostrictive material. A sonic device launches sonic wave pulses which pass in the vicinity of the magnetostrictive material layer. The sonic wave pulse stresses the magnetostrictive material, and when the magnetostrictive material is magnetically influenced by a bubble, the stress changes or rotates its magnetization thereby inducing an electric signal in the conductor. When a bubble is not near the magnetostrictive material, no signal will be produced. The sonic wave pulse may be launched as either a surface wave on, or a bulk wave in the bubble supporting material, or it may be launched in a material substrate, capable of supporting acoustic waves, which is in contact with the magnetostrictive material. The shape of the magnetostrictive thin film element may have different geometrics, including long strips.

12 Claims, 21 Drawing Figures

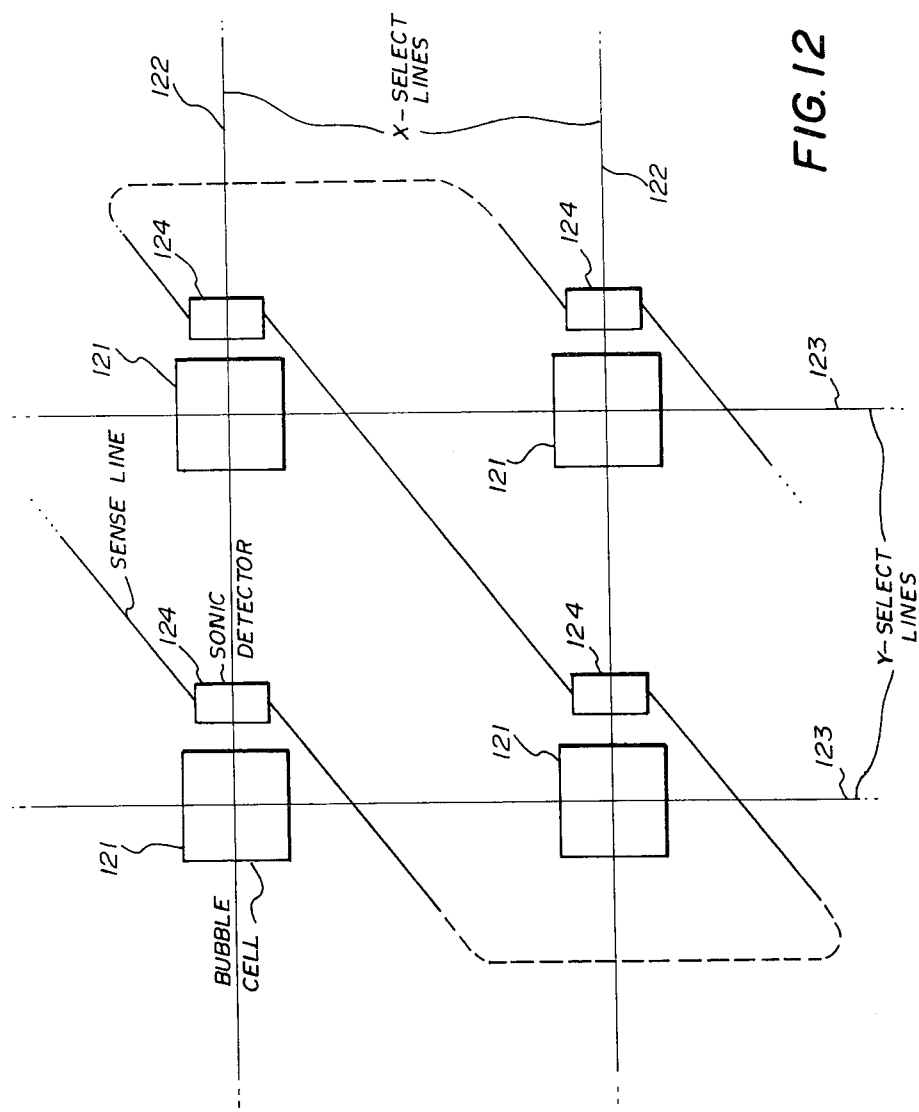

SONIC MAGNETIC DOMAIN SENSOR

This invention is directed to magnetic bubble domain sensors and in particular to a novel sonic sensor for detecting magnetic bubbles in a film of magnetic material.

Presently, five types of bubble domain detection techniques exist: inductive, magnetooptic, galvanomagnetic, magnetoresistive, and magnetostrictive-piezoelectric.

Detection of bubble-domains was first done inductively with a pickup loop (bubble diameter ~100μm). Methods of inductively sensing the signal from a propagating bubble are limited to the order of 100μV per output channel per turn of a pickup loop. They produce a transient output signal, i. e. the signal depends on the velocity of the bubble. In addition, the signal decreases with decreasing of the diameter of the bubble because of the small amount of available magnetic flux.

Magnetooptic detection appears to have potential, however, because of the sophisticated packaging requirements of such a system, difficulties arise in its practical implementation.

Hall-effect sensors furnish up to a 2-mV signal for 300 mV input and a 130μm bubble. Bubbles as small as 10μm have been detected with smaller signals. However, the manufacturing process of these detectors is difficult; they have four terminals, require relatively high power per unit area, and have a poor temperature stability of their resistance.

Magnetic film magnetoresistive devices can produce signals of several millivolts from a single output channel. Their physical properties are better than those of the Hall-effect detectors, and they are used in most of the present practical bubble devices.

The galvanomagnetic and magnetoresistive detectors require an external power supply. Therefore, their signal to noise ratio is affected by the exciting current.

Finally, the magnetostrictive-piezoelectric detector, a device described in U.S. Pat. No. 3,909,809 which issued Sept. 30, 1975 to Witold Kinsner and Edward Della Torre and assigned to Canadian Patents and Development Limited, converts bubble domain magnetic energy to mechanical energy that in turn is converted to electrical energy. This detector provides a relatively high output signal with a minimum of noise since there is no current provided from an external source.

It is therefore an object of this invention to provide a sensor for the detection of propagating as well as stationary bubbles.

It is a further object of this invention to provide a sensor having a large output signal and a high signal-to-noise ratio.

It is another object of this invention to provide a sensor which may be utilized in sequential or parallel read-out arrangements.

It is a further object of this invention to provide a sensor having a fast read-out.

These and other objects are achieved in a device for sensing the presence or absence of a magnetic bubble domain at predetermined location in a bubble supporting material which includes a magnetostrictive material layer, such as a thin film having an area approximately equal to the area of a bubble domain, positioned with respect to the bubble material such that it is magnetically influenced by the closure field of a bubble at the predetermined location; a conductor, such as a strip conductor, in contact with the magnetostrictive material; and a sonic device for launching sonic wave pulses which pass in the vicinity of the magnetostrictive material layer. The sonic wave pulse stresses the magnetostrictive material when the magnetostrictive material is influenced by a bubble, the stress changes the magnetic flux crossing the conductor thereby inducing an electrical signal in the conductor. The change of magnetic flux crossing the conductor is produced by the stress which induces a change of magnetization magnitude, a magnetization rotation, or both in the magnetostrictive material. When a bubble is not near the magnetorestrictive material, no signal will be produced. The sonic wave pulse may be launched as either a surface wave on or a bulk wave in the bubble supporting material or it may be launched in a substrate, capable of supporting accoustic waves, which is in contact with the magnetostrictive material.

Figure 9:
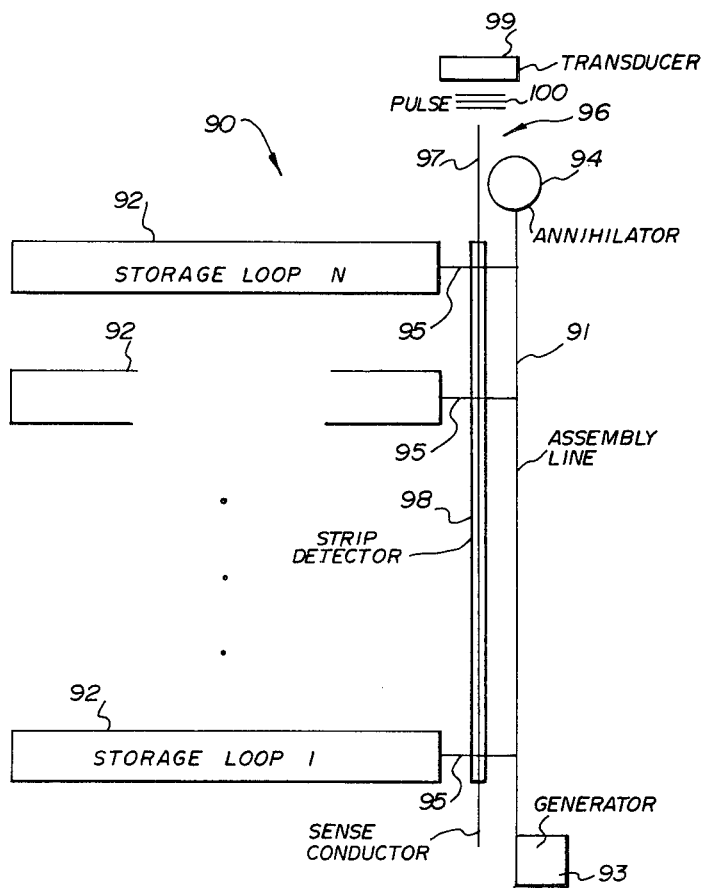
Figure 10:
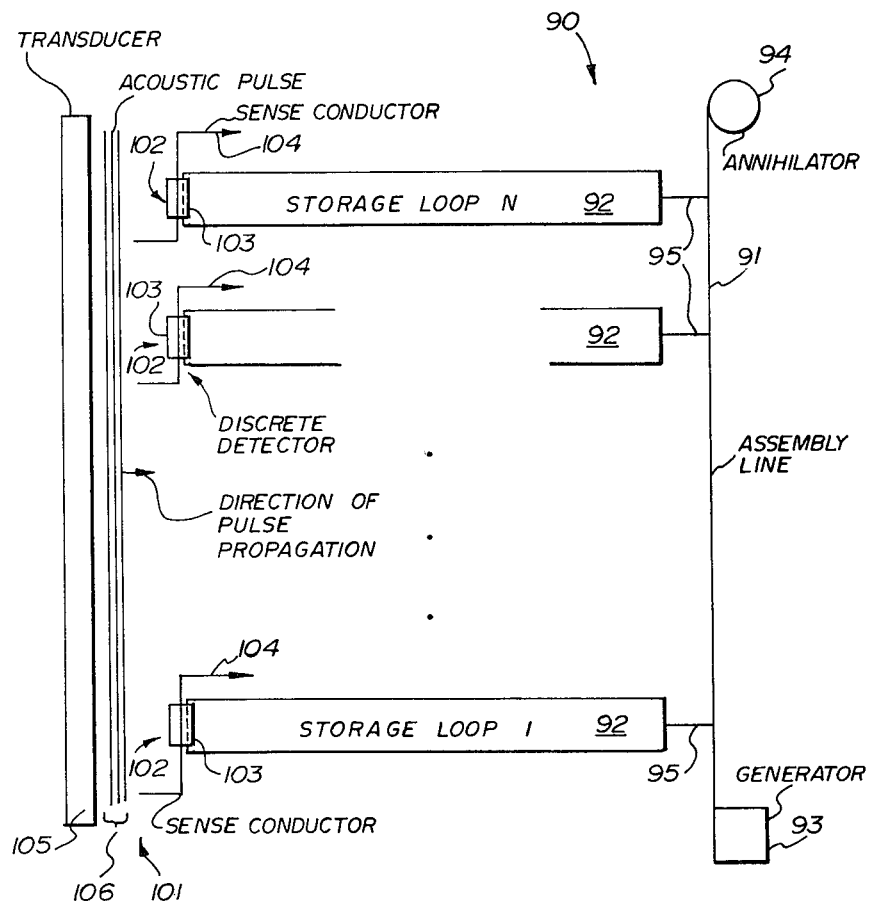
Figure 11:
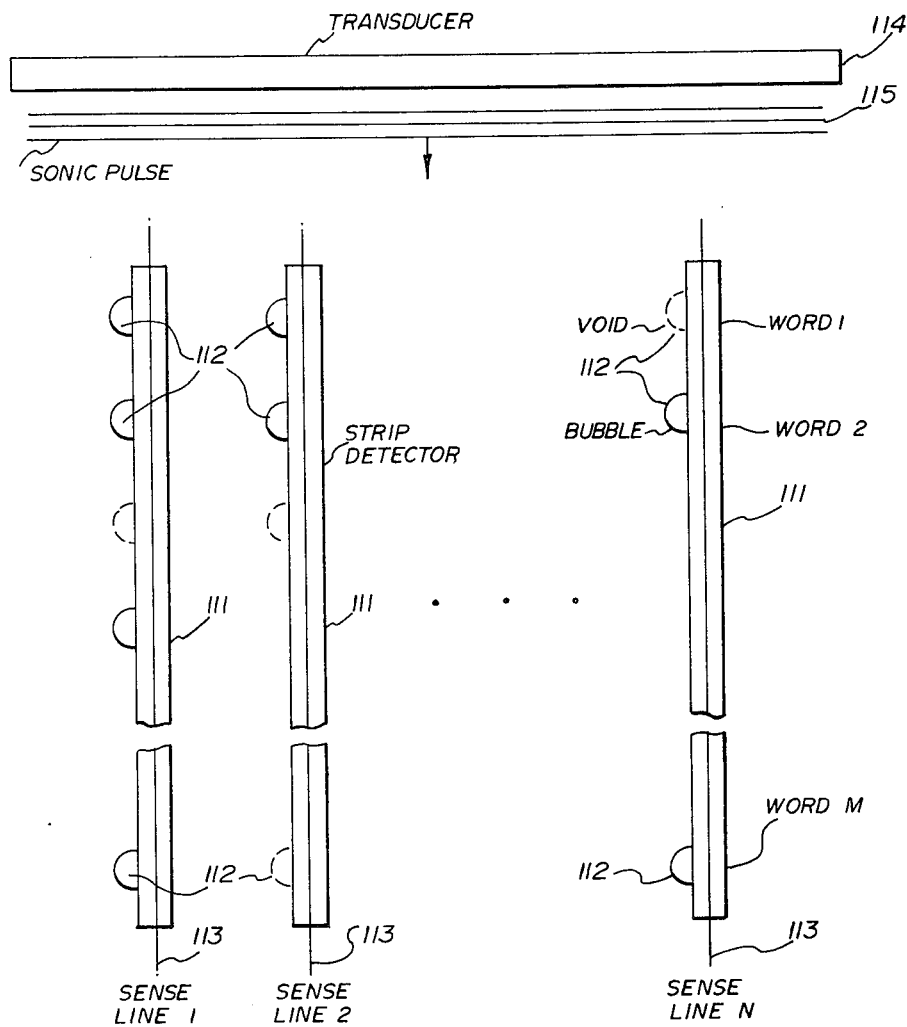

FIGS. 9, 10, and 11 illustrate applications of the sensor in accordance with this invention to major-minor loop bubble domain memories.

FIG. 12 illustrates the application of the sensors in accordance with this invention to bubble domain random access memories.

The magnetic bubble domain sensor in accordance with the present invention is based on the phenomena that a magnetized magnetostrictive material changes its magnetization when subjected to a mechanical stress. The mechanical stress may be produced in the magnetostrictive material by surface or bulk sonic waves and the rapid change in magnetization may be detected by coupling a conductor with the magnetostrictive material such that the change in magnetization induces an electric signal in the conductor.

The change in magnetization may take the form of (1) a change of magnetization magnitude in the magnetostrictive material or (2) a magnetization rotation in the magnetostrictive material, which individually or in combination result in a change in magnetic flux crossing the conductor to induce the electrical signal in the conductor. The principles involved in the generation of an electrical signal on the sense conductor by the two magnetization changes in a stressed magnetostrictive material are individually illustrated in FIGS. 1 and 2 respectively.

Figure 1A:
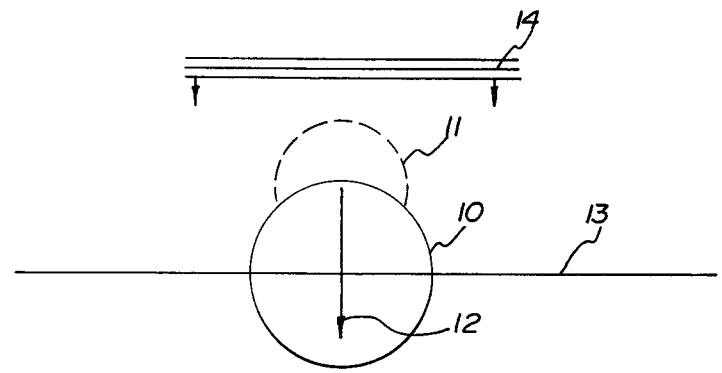
FIGS. 1a to 1c illustrate the operation of a sensor in accordance with this invention based on stress caused change in magnetization magnitude.
Figure 1B:
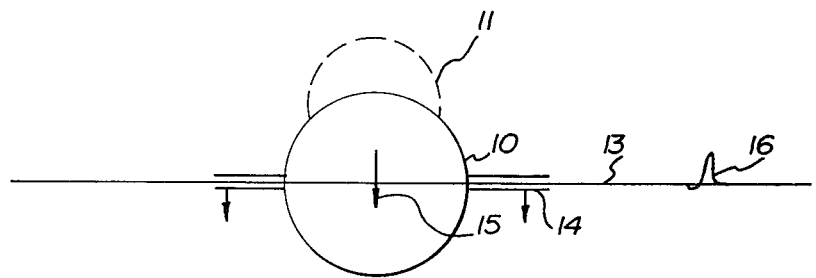
Figure 1C:
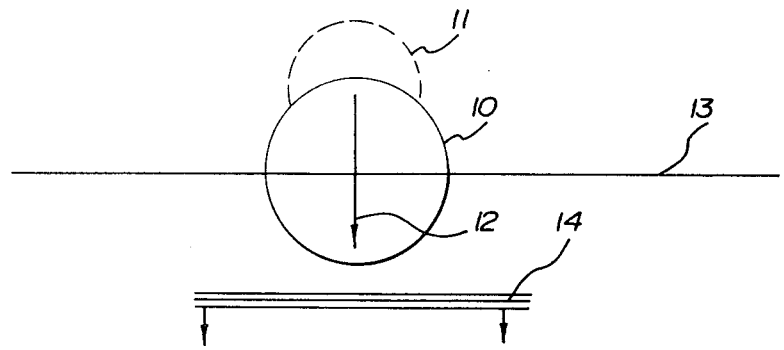

In FIGS. 1a, 1b, and 1c a magnetostrictive material element 10 is shown positioned over a bubble supporting material. The element 10 is magnetically influenced by the closure field of bubble 11 to produce a magnetization represented by vector 12 in FIG. 1a. A sense conductor 13 is positioned near the element 10 such that the magnetic flux lines cross the conductor 13. A sonic pulse 14 is launched towards the magnetostrictive element 10. Before the pulse reaches element 10 as in FIG. 1a, the element 10 is unaffected. As the sonic pulse passes under the magnetostrictive element 10, as shown in FIG. 1b, a change in magnetization magnitude occurs in the magnetostrictive element 10 as represented by vector 15, thereby changing the magnetic flux crossing the sense conductor 13 and inducing an electrical signal 16 in the conductor 13. After the pulse has passed the element 10, the magnetization magnitude returns to its former state as represented by vector 12 in FIG. 1c. If there is no bubble 11 present in the vicinity of element 10 as the pulse 14 passed under the element 10, no signal will be produced on the sense conductor 13. Thus an output signal 16 on sense conductor 13 indicates the presence of a bubble 11 in the vicinity of the magnetostrictive material element 10 whether the bubble is stationary or in motion.

Figure 2A:
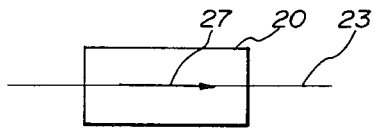
FIGS. 2a to 2h illustrate the operation of a sensor in accordance with this invention based on stress caused change in magnetization rotation.
Figure 2B:
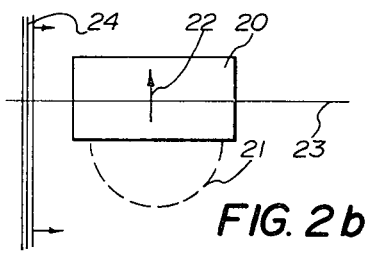
Figure 2F:
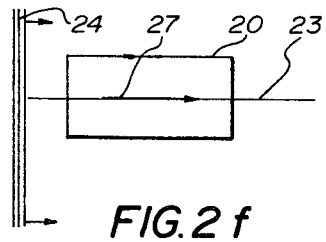
Figure 2C:
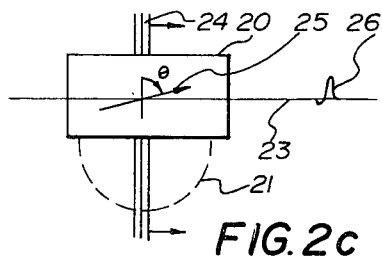
Figure 2G:
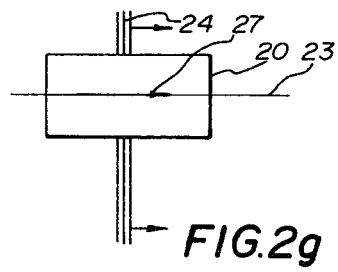
Figure 2D:
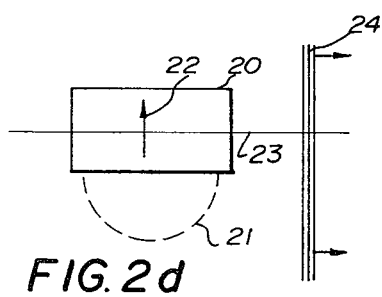
Figure 2H:
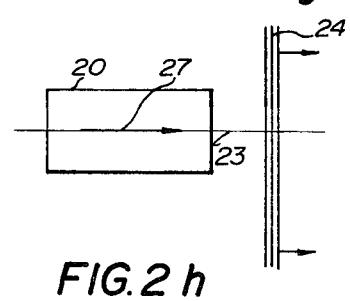
Figure 2E:
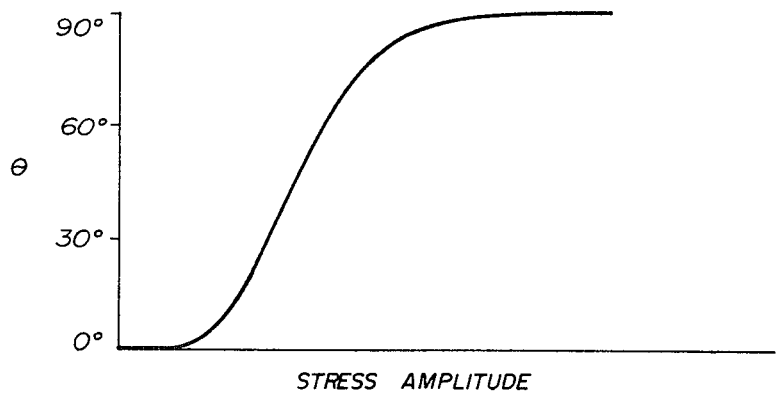

In FIGS. 2a to 2d, and 2f to 2h, a magnetostrictive material element 20 is shown positioned over a bubble supporting material. The magnetostrictive material may be isotropic, however is preferably anisotropic such that element 20 has an easy direction of magnetization as shown by arrow 27 in FIG. 2a. The anisotropicity of element 20 may be produced by the shape of element 20 if it is rectangular, oval, etc. or by the method used in its deposition. A sense conductor 23 is positioned near element 20, usually parallel to the direction of easy magnetization. When a bubble 21 is in the vicinity of element 20 as shown in FIGS. 2b to 2d, the closure field of the bubble 21 influences the magnetization of element 20. As shown in FIG. 2b, the closure field of the bubble rotates the magnetization in the anisotropic magnetostrictive material element 20 as represented by vector 22. When a sonic pulse 24 is launched towards the magnetostrictive element 20 and passes under element 20 as shown in FIG. 2c, the magnetization rotates by an angle $\theta$, vector 25, thereby changing the magnetic flux crossing the sense conductor 23 and inducing an electrical signal 26 in the conductor 23. When the sonic pulse 24 propagates past the element 20, the magnetization rotates back to its original position, vector 22, as shown in FIG. 2d. The angle $\theta$, and therefore the signal amplitude, depends on the stress amplitude of the sonic pulse 24 in FIG. 2e. As stated above, the magnetic material is preferably anisotropic as this increases the angle of rotation and therefore the output signal 26. If there is no bubble 21 in the vicinity of element 20, no signal 26 is produced when the sonic pulse 24 passes element 20 as shown in FIG. 2f to 2h because there is no rotation of magnetization in the anisotropic magnetostrictive material element 20, and hence, no change in the magnetic flux crossing the sense conductor 23.

Figure 3:
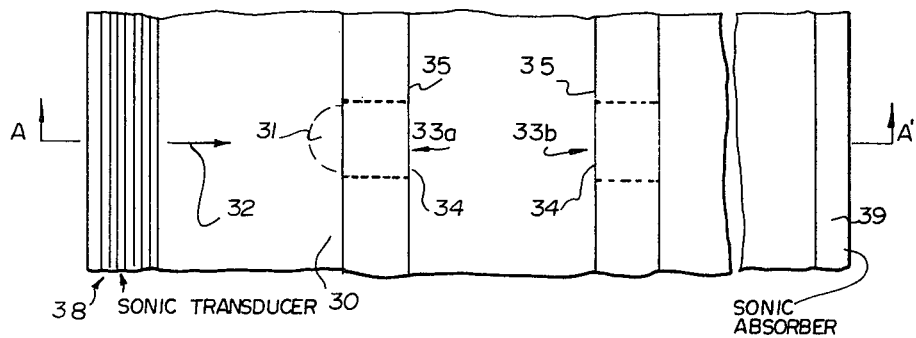
FIG. 3 illustrates in top view, one embodiment of the bubble domain sensor in accordance with this invention.
Figure 4:
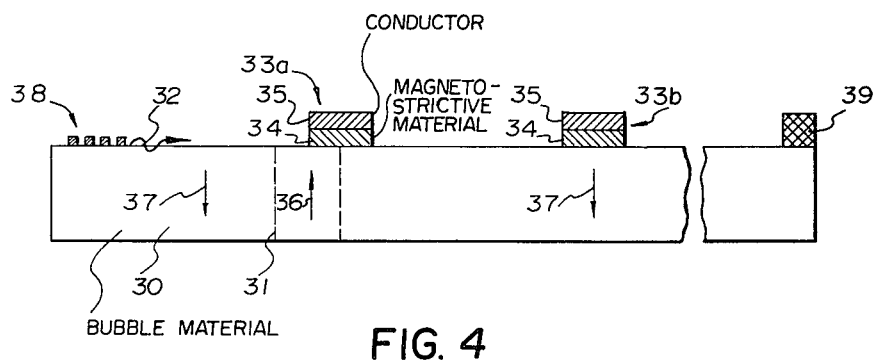
FIG. 4 is a cross-section of the embodiment in FIG. 3 taken along plane A - A'.

One embodiment of the sonic magnetostrictive sensor in accordance with the present invention is illustrated in FIGS. 3 and 4 wherein 30 is a film of conventional bubble supporting material, such as orthoferrites, garnets, cobalt, or amorphous material, through which bubbles 31 are propagated. The bubble domain sensor includes one or more detectors 33a, 33b ... consisting of a film 34 of magnetostrictive material positioned over the bubble material 30 at predetermined locations such that moving bubbles will pass under the film 34 along one or the other of its perpendicular dimensions or stationary bubbles will rest under one of its edges, and a conductor 35 in contact with the magnetostrictive film 34. The film 34 may be square, rectangular as shown or have any other appropriate shape, including long strips, however it is preferred that its area be approximately the same as the bubble 31 area. The magnetostrictive materials used in the detectors 33a, 33b ... should not affect the propagation of bubbles 31 in the supporting material, the deposition procedure should be easy, and the material should approach saturation magnetization or the optimum rotation of the magnetization in the presence of the bubble closure field. Magnetostrictive nickel-iron alloys satisfy these requirements, in particluar Ni-Fe alloys in the range 45 to 68% Ni in Fe. Other alloys, such as Ni-Fe-Co, Ni-Fe-Mn, etc., may also be used. The magnetostrictive film 34 can be either anisotropic or isotropic.

The magnetization of a bubble 31 is antiparallel to the magnetization of the surrounding bubble material 30 as shown by arrows 36 and 37 respectively, and the closure field of the bubble 31 either magnetizes the magnetostrictive material film 34 or appropriately rotates the magnetization of the film 34 of a detector 33a to which it is in close proximity. The distribution of the bubble 31 closure field is such that a bubble located approximately two bubble diameters from the detector will not sufficiently influence the magnetization of the magnetostrictive film 34 and since bubbles are usually propagated with maximum density of approximately three bubble diameters, detection under all conditions is assured.

In order to apply a mechanical stress to the magnetostrictive film 33 to achieve the change in magnetization, a sonic surface wave transducer 38, appropriately positioned, for example, on one edge of the support film 30, is pulsed to launch a sonic wave 32 which may be acoustic, ultrasonic or hypersonic over the surface of the bubble material 30. The short sonic wave pulse 32 passes in the vicinity of the detectors 33a, 33b ..., changing the magnetization magnitude or rotation, or both of the magnetostrictive film 34 in the detectors 33a, 33b ... which are magnetically influenced by a bubble 31 depending on the position of the bubble 31 with respect to the detectors 33a, 33b ... and the direction of travel of the sonic pulse 32 as described in FIGS. 1 and 2. This change in magnetization induces an electric signal in the conductor 35. In FIGS. 3 and 4, an electrical signal will be produced in the conductor 35 of detector 33a but not in the conductor 35 of detector 33b, to indicate the presence of a bubble 31. Finally, a conventional sonic wave absorbing material 39 may be appropriately positioned, for example, on the edge opposite to transducer 38 of the supporting film 30 to absorb the sonic wave 32 and thus prevent its reflections.

The dimensions of the sonic transducer 38 are determined by factors such as the dimensions and the distribution of the magnetostrictive detectors 33a, 33b ..., the acoustic propagation velocity of the pulse propagating material 30, desired frequency of the acoustic pulses 32. In general, the acoustic pulses 32 do not have to be directed in special channels, for they will propagate toward and past the magnetostrictive detectors 33a, 33b ....

The sensor does not require any external current supply to activate the detectors 33a, 33b ...; only an electrical pulse must be provided to transducer 38 to launch the sonic pulse 32. The signal from the detector does not depend on the bubble velocity since the acoustic pulse velocity is greater than the bubble velocity; therefore, the bubble may even be stationary under the detectors 33a, 33b ..., or moving under it at maximum speed. The magnitude of the output signals from the detectors 33a, 33b ... is dependent on the propagation velocity of the pulses 32 since the amplitude of the output signal is directly related to the change in flux per unit time, and may be as high as 600 mV. Since no current is supplied to the detectors, the signal-to-noise ratio is high.

Figure 5:
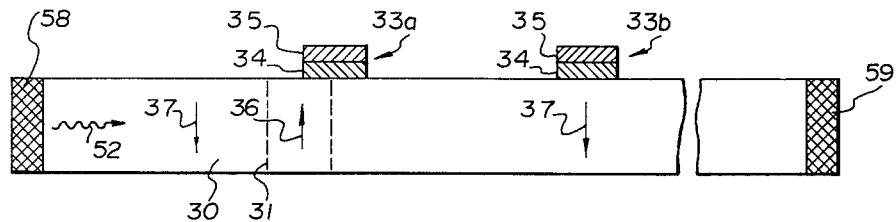
FIG. 5 illustrates in cross-section a sensor similar to the one in FIG. 3 having a bulk wave transducer.

The transducer 38 shown in FIGS. 3 and 4 launches surface sonic waves 32, however, as shown in FIG. 5, a bulk wave transducer 58 may be positioned down the side of the bubble supporting material 30 to launch a bulk wave 52 through the bubble support material 30 to achieve similar results. In this embodiment, the absorber 58 is positioned down the opposite side of the bubble support material.

Figure 6:
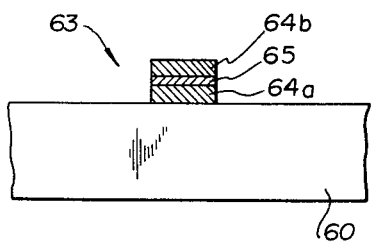
FIGS. 6 and 7 illustrate modifications to the detector.
Figure 7:
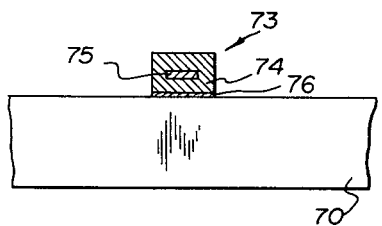

The configuration of the detectors 33a, 33b . . . , shown in FIGS. 3 to 5 may vary somewhat as long as the magnetostrictive material film 34 is positioned so as to be magnetically influenced by the closure field of bubble 31 and stressed by the surface sonic wave pulse 32 or the bulk sonic wave pulse 52. In addition, the conductor 35 must be in intimate contact with the magnetostrictive material film 34. FIG. 6 illustrates a detector 63 positioned over bubble supporting material 60 in which the conductor 65 is sandwiched between a first layer 64a of magnetostrictive material and a second layer 64b of magnetostrictive material. This arrangement induces a greater signal in conductor 65. FIG. 7 illustrates a further detector 73 positioned over bubble supporting material 70 in which a portion of the conductor 75 is enveloped by magnetostrictive material 74. This detector 73 induces an even greater signal in conductor 75 but is more complex to manufacture. In addition, a very thin film 76 non-magnetic insulating material such as $SiO_2$ having a thickness of 0 to 1 $\mu$ may be placed between material 70 and detector 73 to prevent the trapping of bubbles by flaws in the magnetostrictive film 74. Such a film 76 may be used with all of the detectors described.

Figure 8:
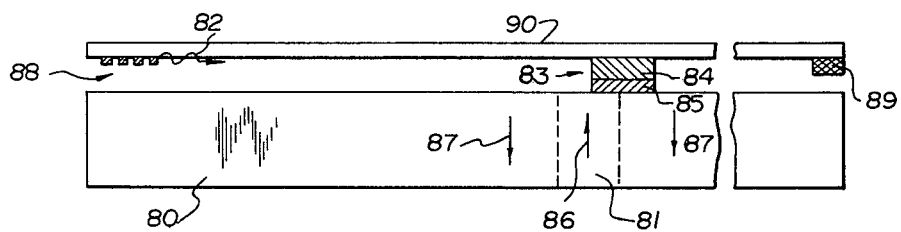
FIG. 8 illustrates in cross-section a sensor in which waves are launched in a separate substrate.

The magnitude of the output signal is dependent on the speed of propagation of the sonic pulse through the sonic wave porpagation medium which in the devices illustrated in FIGS. 3 to 5, is the bubble supporting film 30. The material used in film 30 is fixed by the requirements of bubble stability and propagation. In order to overcome the speed constraint imposed by the bubble material 30, the embodiment of the sensor illustrated in FIG. 8 may be utilized. Bubbles 81 are propagated through the bubble supporting material 80 and produce a magnetization shown by arrow 86 which is anti-parallel to the magnetization of the surrounding material 80 as shown by arrows 87. The sensor includes one or more detectors 83 consisting of a film 84 of magnetostrictive material which is positioned over a conductor 85 at a predetermined location on the bubble supporting material. A substrate 90 having a high acoustic wave velocity is positioned over the film 84 to be in intimate contact with it. The substrate 90 may be made of high acoustic velocity material. A surface wave transducer 88 is located under the edge of the substrate 90 to launch short sonic wave 82 pulses along the surface of the substrate 90 towards the detector 83 to change the magnetization of the magnetostrictive film 84. The sensor may further include an absorber 89 under the opposite edge of the substrate 90. The magnetostrictive film 84 is located between the conductor 85 and the substrate 90 so as to receive the full effect of the sonic wave 82 while at the same time be magnetized by the bubble 81 closure field. The space between the substrate 90 and the bubble support material 80 may consist of a non-conducting non-magnetic material.

The bubble sensor according to this invention can be used in both the serial and the random access bubble memories. Its application in the serial bubble memories would complement other existing readout schemes, providing data rates much higher than any existing readout technique. The application of the sonic detector to the bubble random access memories (RAM's) can make the bubble RAM's feasible and practical.

FIG. 9 illustrates one embodiment of the application of the sensor in accordance with this invention to a conventional serial bubble memory to achieve high speed serial bubble readout. The bubble memory 90, shown schematically, includes a major or assembly line 91 to which are connected N minor or storage loops 92. The major line has a bubble generator 93 at one end, a bubble annihilator 94 at the other end and N transfer gates 95 to move bubbles to and from the storage loops 92. A sensor 96 is positioned between the assembly line 91 and the storage loops 92 as shown, or across the storage loops at some predetermined location. The sensor 96 may consist of a number of discrete magnetostrictive element detectors appropriately located, and serially connected by a single conductor 97, or a single magnetostrictive strip 98 in contact with the conductor 97. The sensor 96 further includes a sonic transducer 99 which is positioned so as to generate a sonic pulse 100 that will propagate along the detector. A word stored in the N storage loops 92 and to be read out is propagated in parallel toward the sensor 96. When the word is positioned at the sensor 96, a sonic pulse 100 is launched and propagated under the strip 98 producing serial electrical signals on the sense conductor 97. The signals on the sense line 97 duplicate the word consisting of bubbles in the vicinity of the magnetostrictive strip 98.

There are two distinct advantages of this scheme over the conventional bubble readout schemes. First, since the propagation velocities of sonic waves are much greater than those of bubbles, the data rates will be much higher accordingly, because the sonic waves and not the bubbles are propagated in this arrangement. Second, a word to be read out does not have to be transferred to the assembly line 91, where an ordinary single detector is positioned and under which the word must be propagated, but the word is read directly in the vicinity of the storage loops, thus a substantial saving can be achieved in the read time and external logic necessary to control the ordinary readout procedure. It should be noted that this scheme has only one sense line, that is, the same number of wires as an ordinary single bubble detector.

FIG. 10 illustrates an embodiment of the application of the sensor in accordance with this invention to a conventional serial bubble memory to achieve high speed parallel bubble readout. Once again, the bubble memory 90 shown schematically, includes an assembly line 91 to which are connected N storage loops 92. The assembly line 91 has a bubble generator 93 at one end, a bubble annihilator 94 at the other end, and N transfer gates 95 to move bubbles to and from the storage loops 92. In this embodiment, the sensor 101 may include a detector 102 positioned over a predetermined location in each of the storage loops 92. Each detector has a magnetostrictive element 103 and a sense conductor 104. The detectors 102 may alternately consist of a strip of magnetostrictive material with a sense conductor for each of the storage loops. The sensor 101 further includes a sonic transducer 105 capable of generating a broad sonic pulse 106 which will propagate towards the detectors 102 so that a pulse 106 will pass under all of the detectors 102 simultaneously. Since the pulse 106 interacts with each detector 102, an output pulse will be produced on each of the sense lines 104 of the detectors 102 where a bubble is present, providing a parallel output reading of the word in the storage loops 92.

The sensor configuration illustrated in FIGS. 9 and 10 may be combined to provide high speed readout from a major-minor loop memory whereby successive parallel N bit words are read out serially as shown schematically in FIG. 11. For simplicity, the storage and assembly loops are not shown. The readout arrangement includes a number N of parallel strip detectors 111, each located over M predetermined bubble readout positions 112 in the bubble memory, each detector having a sense line 113. The arrangement further includes a sonic transducer 114 positioned perpendicular to the strip detectors 111 for generating a broad sonic pulse 115 towards the detectors 111. The sonic pulse 115 travels along the N strip detectors 111, encountering successive N bit words. Since it takes time for the sonic pulse 115 to propagate from one word location to another, the output signals for each word will appear sequentially on parallel lines 113 for word 1 to word M. This readout arrangement is particularly fast since sonic pulse propagation is faster than bubble propagation and the bubbles for successive words need not be moved sequentially to one readout location.

The bubble domain sensor in accordance with this invention is particularly useful in bubble random access memories which have bubble cells capable of storing at least two binary states with writing and reading functions controlled externally and selectively since the sensor can detect stationary bubbles. This type of cell is described in U.S. application Ser. No. 632,803 filed on Nov. 17, 1975 by Kinsner and Della Torre assignors to Canadian Patents and Development Limited which issued to U.S. Pat. No. 4,059,829 on Nov. 22, 1977 and U.S. Pat. No. 3,513,452 which issued on May 19, 1970 to Bobeck, Della Torre, and Thiele assignors to Bell Telephone Laboratories. Such a RAM readout arrangement is illustrated in FIG. 12. The RAM includes bubble cells 121 which are located at the intersections of X-select lines 122 and Y-select lines 123 on a memory plane. Each cell 121 has one or more detectors 124 positioned in the vicinity of the cell 121 at appropriate locations to detect the states of the bubble cell 121. A single sense line 125 only is required to connect all of the detectors 124 since readout is controlled selectively by the X and Y select lines 122 and 123, and by connecting the detectors appropriately, as shown, unwanted signals are cancelled.

We claim:

1. A device for sensing a magnetic bubble domain at a predetermined location in bubble supporting material comprising:
   magnetostrictive means positioned with respect to said bubble supporting material to be magnetically influenced by the closure field of a bubble domain at said predetermined location;
   conductor means in contact with said magnetostrictive means; and
   sonic means for launching a sonic wave pulse which propagates past the vicinity of said magnetostrictive means in a predetermined direction for stressing said magnetostrictive means to rotate the magnetization of said magnetostrictive means when magnetically influenced by the closure field of a bubble domain, thereby inducing an electric signal in said conductor means to indicate the presence of the bubble domain.

2. A device for sensing a magnetic bubble domain at a predetermined location in bubble supporting material comprising:
   a strip of conductive material positioned on said bubble supporting material crossing said predetermined location;
   a thin film of magnetostrictive material deposited over said conductive strip and positioned with respect to said bubble supporting material to be magnetically influenced by the closure field of a bubble domain at said predetermined location; and
   a sonic means having a substrate positioned with one surface in contact with the thin film of magnetostrictive material, for propagating a sonic wave pulse on said one surface past the thin film of magnetostrictive material to change the magnetization of said magnetostrictive material when magnetically influenced by the closure field of a bubble domain, thereby inducing an electric signal in said strip conductor to indicate the presence of the bubble domain.

3. A device for sensing a magnetic bubble domain at a predetermined location in bubble supporting material comprising:
   a thin film strip of magnetostrictive material deposited over the surface of the bubble supporting material in a position so as to be magnetically influenced by the closure field of a bubble domain at said predetermined location;
   conductor means in contact with said magnetostrictive means; and
   sonic means for launching a sonic wave pulse which propagates past the vicinity of said magnetostrictive means stressing said magnetostrictive means to change the magnetization of said magnetostrictive means when magnetically influenced by the closure field of a bubble domain, thereby inducing an electric signal in said conductor means to indicate the presence of the bubble domain.

4. A device for sensing a magnetic bubble domain at a predetermined location in bubble supporting material comprising:
   magnetostrictive means positioned with respect to said bubble supporting material to be magnetically influenced by the closure field of a bubble domain at said predetermined location, said magnetostrictive means including a first thin film of magnetostrictive material deposited over the surface of the bubble supporting material;
   conductor means in contact with said magnetostrictive means; and
   sonic means for launching a sonic wave pulse which propagates past the vicinity of said magnetostrictive means stressing said magnetostrictive means to change the magnetization of said magnetostrictive means when magnetically influenced by the closure field of a bubble domain, thereby inducing an electric signal in said conductor means to indicate the presence of the bubble domain.

5. A device as claimed in claim 4 wherein said magnetostrictive material is selected from the group consisting of Ni-Fe, Ni-Fe-Co, or Ni-Fe-Mn.

6. A device as claimed in claim 4 wherein said magnetostrictive thin film has an area approximately equal to the area of the bubble.

7. A device as claimed in claim 4 wherein said magnetostrictive means further includes a thin film of nonmagnetic insulating material located between the film of magnetostrictive material and the surface of the bubble supporting material.

8. A device as claimed in claim 4 wherein said conductor means includes a deposited strip of conductive material crossing over said thin film of magnetostrictive material.

9. A device as claimed in claim 8 wherein said magnetostrictive means further includes a second thin film of magnetostrictive material deposited over the conductive material at the predetermined location.

10. A device as claimed in claim 9 wherein said second thin film of magnetostrictive material overlaps the first thin film of magnetostrictive material to envelop a portion of the conductor means.

11. A device as claimed in claim 4 wherein said sonic means includes sonic transducer means located on the surface of the bubble supporting material to launch sonic surface waves on the bubble supporting material.

12. A device as claimed in claim 4 wherein said sonic means includes sonic transducer means located on the edge of the bubble supporting material to launch sonic bulk waves within the bubble supporting material.

* * * * *